US012591030B2

(12) United States Patent (10) Patent No.: US 12,591,030 B2
Beck (45) Date of Patent: Mar. 31, 2026

(54) K-SPACE SAMPLING FOR ACCELERATED STACK-OF-STARS MAGNETIC RESONANCE IMAGING USING COMPRESSED SENSE AND AI

(71) Applicant: KONINKLIJKE PHILIPS N.V., Eindhoven (NL)

(72) Inventor: Gabriele Beck, Venlo (NL)

(73) Assignee: Koninklijke Philips N.V., Eindhoven (NL)

( * ) Notice: Subject to any disclaimer, the term of this patent is extended or adjusted under 35 U.S.C. 154(b) by 214 days.

(21) Appl. No.: 18/286,371

(22) PCT Filed: Apr. 14, 2022

(86) PCT No.: PCT/EP2022/060055
§ 371 (c)(1),
(2) Date: Oct. 11, 2023

(87) PCT Pub. No.: WO2022/223440
PCT Pub. Date: Oct. 27, 2022

(65) Prior Publication Data
US 2024/0192297 A1 Jun. 13, 2024

(30) Foreign Application Priority Data
Apr. 19, 2021 (EP) .................................... 21169143

(51) Int. Cl.
*G01R 33/48* (2006.01)
*G01R 33/56* (2006.01)
(52) U.S. Cl.
CPC ....... *G01R 33/482* (2013.01); *G01R 33/5608* (2013.01)
(58) Field of Classification Search
None
See application file for complete search history.

(56) References Cited

U.S. PATENT DOCUMENTS 7,592,808 B1 * 9/2009 King ................ G01R 33/56545
324/307
8,165,657 B2 * 4/2012 Krueger ............. G01R 33/5613
600/407

(Continued)

FOREIGN PATENT DOCUMENTS

CN       101975936 A     2/2011
EP         3709042 A1    9/2020
WO     2016202707 A1    12/2016

OTHER PUBLICATIONS

Arson et al "Anisotroic Field of Views in Radial Imaging" IEEE Transactions on Medical Imaging, vol. 27, No. Jan. 1, 2008 p. 47-57.

(Continued)

*Primary Examiner* — Richard Isla

(57) ABSTRACT

Disclosed herein is a medical system (100, 300) comprising a memory (110) storing machine executable instructions (120) and a computational system (104). The execution of the machine executable instructions causes the computational system to receive (200) k-space data (122) and reconstruct (202) at least one three-dimensional magnetic resonance image (124) from the k-space data. The k-space data comprises lines of k-space data (510, 514) sampled according to a three-dimensional stack of stars sampling pattern (500). The three-dimensional stack of stars comprises discrete sampling planes (508) distributed periodically along a cartesian sampling direction axis (506). The lines of k-space data pass through the cartesian sampling direction axis. The lines of k-space are perpendicular to the cartesian sampling direction axis. At least a portion of the lines of k-space data (514) are distributed between the discrete sampling planes.

20 Claims, 8 Drawing Sheets

(56)  References Cited

U.S. PATENT DOCUMENTS

| | | | | |
|---|---|---|---|---|
| 9,702,956 | B2 * | 7/2017 | Kawaji | G01R 33/5673 |
| 10,670,678 | B2 * | 6/2020 | Beck | G01R 33/5601 |
| 11,067,653 | B2 * | 7/2021 | Beck | G01R 33/50 |
| 11,896,361 | B2 * | 2/2024 | Kutsuna | G01R 33/5611 |
| 11,914,016 | B2 * | 2/2024 | Krishnamoorthy | |
| | | | | G01R 33/5607 |
| 2013/0006098 | A1 * | 1/2013 | Schmitt | G01R 33/5635 |
| | | | | 600/419 |
| 2015/0327783 | A1 | 11/2015 | Wang et al. | |
| 2018/0149720 | A1 | 5/2018 | Zhao et al. | |
| 2020/0116810 | A1 * | 4/2020 | Wang | G01R 33/5676 |
| 2020/0150206 | A1 | 5/2020 | Beck | |
| 2020/0309883 | A1 | 10/2020 | Ding et al. | |

OTHER PUBLICATIONS

Wu et al "Anisotropic Field of View Support for Golden Angle Radial Imaging" Magn. Reson. Med. Jul. 2016, 76(1) p. 229-236.

Wundrak et al "Golden Ratio Sparse MRI Using Tiny Golden Angles" Magn. Reson. Med Jun. 2016(6) p. 2372-2378.

Li Feng et al "Motion Resolved Golden Angle Radial Sparse MRI Using Variable-Density Stack of Stars Sampling" Proceedings of the International Society for Magnetic Resonance in Med. Vol. 24, Apr. 22, 2016.

Bruer et al Controlled Aliasing in Volumetric Parallel Imaging (2D Caimirinha) Magnetic Resonance in Med. vol. 55, No. 3 Jan. 11, 2006 p. 549-556.

Beck et al "High Spatial Temporal Free Breathing T1 Contrast Enhanced Imaging using a Novel 4D Variable Density, Elliptical Centric Radial Stack of Stars Sharing Approach" Proceedings of the Int. Soc. for Magnetic Reson. in Med. Vol 26, Jun. 1, 2018.

7 International Search Report and Written Opinion from PCT/EP2022/060055 mailed Aug. 14, 2022.

* cited by examiner

K-SPACE SAMPLING FOR ACCELERATED STACK-OF-STARS MAGNETIC RESONANCE IMAGING USING COMPRESSED SENSE AND AI

CROSS REFERENCE TO RELATED APPLICATIONS

This application is a U.S. national phase application of International Application No. PCT/EP2022/060055 filed on Apr. 14, 2022, which claims the benefit of EP Application Ser. No. 21/169,143.1 filed on Apr. 19, 2021 and is incorporated herein by reference.

FIELD OF THE INVENTION

The invention relates to magnetic resonance imaging, in particular to stack-of-stars sampling patterns in k-space for magnetic resonance imaging.

BACKGROUND OF THE INVENTION

Various tomographic medical imaging techniques such as Magnetic Resonance Imaging (MRI), Computed Tomography, Positron Emission Tomography, and Single Photon Emission Tomography enable detailed visualization of anatomical structure of a subject. A common feature of all of these imaging modalities is that it takes a significant amount of time to acquire the medical imaging data necessary to reconstruct a medical image. During magnetic resonance imaging, data is sampled in k-space. The measured k-space data is then reconstructed into a magnetic resonance image. One means to accelerate the acquisition of a magnetic resonance image is to deliberately undersample the k-space and reconstruct the magnetic resonance image using a Compressed Sensing (CS) algorithm. Undersampling can result in image artifacts. However, if the undersampling is done using a random or pseudorandom sampling the undersampling artifacts will largely manifest themselves as noise. Magnetic resonance images are represented sparsely of the image in k-space. In MRI, well known CS algorithms are used to iteratively reconstruct the image.

A difficulty commonly encountered during magnetic resonance imaging is that the acquisition of the k-space data may take several minutes and the subject may move. It is therefore desirable to have a means of compensating for the motion of a subject. One technique which is less sensitive to subject motion is so-called radial sampling. Instead of acquiring lines of k-space data using a Cartesian sampling pattern lines or spokes of k-space data are acquired within a plane at different rotational angles rotated about an axis. Because the acquired k-space data was not acquired using a single frequency and phase encoding direction it is less sensitive to motion. A stack-of-stars sampling pattern is a three-dimensional k-space sampling pattern used to sample radial acquisition that is repeated on many different planes.

European patent publication EP 3709042 A1 discloses a method of MR imaging of an object. It discloses MR imaging using a 3D radial or spiral acquisition scheme providing an enhanced image quality in the presence of motion. The method comprises the steps of: generating MR signals by subjecting the object to an imaging sequence comprising RF pulses and switched magnetic field gradients; acquiring the MR signals using a 3D radial or spiral acquisition scheme with oversampling of a central portion of k-space; detecting motion-induced displacements and/or deformations of the object during the acquisition of the MR signals and assigning each of the acquired MR signals to a motion state; reconstructing an MR image from the MR signals weighted in the central portion of k-space, wherein a stronger weighting is applied to MR signals acquired in more frequent motion states, while a weaker weighting is applied to MR signals acquired in less frequent motion states. Moreover, the invention relates to a MR device and to a computer program for a MR device.

SUMMARY OF THE INVENTION

The invention provides for a medical system, a computer program, and a method in the independent claims. Embodiments are given in the dependent claims.

During magnetic resonance imaging the sampling of k-space is performed by repeatedly traversing and sampling paths in k-space. These paths are commonly referred to as lines k-space. Different types of sampling patterns can be used depending upon the positioning of lines of k-space and the sample points chosen on the individual lines of k-space.

One technique is the so-called stack-of-stars. In the stack-of-stars, there is a Cartesian sampling direction. For the sake of example, the cartesian sampling direction is arbitrarily chosen to be the $k_z$ direction for some examples herein. The Cartesian sampling directional has a cartesian sampling direction axis. Again, in examples herein the $k_z$ axis is used for concrete example when the Cartesian sampling direction is in the $k_z$ direction. The cartesian sampling direction axis can then be used to define a set of cylindrical coordinates with the cartesian sampling direction axis being the height axis and $k_{angle}$ is used to represent the radial k-space angle used in the Cartesian sampling direction.

In conventional stack-of-stars sampling patterns, the sampling of k-space is performed in discrete sampling planes perpendicular cartesian sampling direction axis. Within each of these planes, lines of k-space are sampled by rotating a line of k-space around the cartesian sampling direction axis. The lines of k-space pass through the cartesian sampling direction axis. When observing a plot showing the position of the lines of k-space, the pattern resembles a stack of stars with a star centered in each of the discrete sampling planes.

Examples may provide for improved image quality by relaxing the requirement that the lines of k-space data are restricted to the discrete sampling planes. In examples, at least a portion of the lines of k-space data are displaced along the cartesian sampling direction axis. These displaced lines of k-space data are still perpendicular the cartesian sampling direction axis and still pass through the cartesian sampling direction axis, but they are not restricted to being in the discrete sampling planes. This may have the benefit that when doing a three-dimensional magnetic resonance imaging reconstruction, the points sampled in k-space may be better distributed. This may result in the quality of the image being better.

Another potential advantage is when the k-space data is undersampled. Undersampling k-space data can lead to artifacts in the resulting magnetic resonance image. Distributing the sample points in k-space better may lead to the resulting undersampling artifacts to better resemble noise. This may in turn lead to an improved means of reconstructing the image using for example a Compressed Sensing (CS) reconstruction algorithm.

In one aspect the invention provides for a medical system that comprises a memory that stores machine-executable instructions and a computational system. Execution of the machine-executable instructions causes the computational system to receive k-space data. The k-space data comprises lines of k-space data sampled according to a three-dimensional stack-of-stars sampling pattern. A stack-of-stars sampling pattern samples k-space data in a Cartesian sampling direction and then in planes within that are perpendicular to the Cartesian sampling direction they are sampled rotationally. That is to say there is a Cartesian sampling direction axis and within a particular plane the sampled lines of k-space data rotate around this Cartesian sampling direction axis.

The three-dimensional stack-of-stars comprises discreet sampling planes distributed periodically along a Cartesian sampling direction axis. Periodically could mean at a set or regular interval displaced along the cartesian sampling axis. The lines of k-space data pass through the Cartesian sampling direction axis and are perpendicular to the Cartesian sampling direction axis. At least a portion of the lines of k-space data are distributed between the discreet sampling planes. Normally in a stack-of-stars sampling pattern the k-space lines are limited to discreet sampling planes. In this embodiment this is not a strict requirement. At least some or a portion of the lines of k-space data are offset from the discreet sampling planes so that they lie between two of the planes. This may have the technical advantage that the k-space data is distributed throughout k-space.

This may have significant advantages when reconstructing a three-dimensional magnetic resonance image from the k-space data. For example, if the k-space data is undersampled an algorithm such as a compressed sensing or artificial intelligence-based reconstruction algorithm may be used to reconstruct the image. These techniques typically rely on undersampling artifacts being manifested as a background noise. By better having the samples of k-space data distributed throughout k-space the approximation as the undersampling artifacts as resembling noise is better. The compressed sensing or artificial intelligence-based reconstruction algorithms may then function better and higher acceleration factors can be achieved.

Execution of the machine-executable instructions further causes the computational system to reconstruct at least one three-dimensional magnetic resonance image from the k-space data.

In another embodiment the at least a portion of the lines of k-space data which are distributed between the discreet sampling planes are distributed irregularly in a linear direction along the Cartesian sampling direction axis. In other words, the lines of k-space data which are not within the discreet sampling planes are offset along the Cartesian sampling direction axis such that they are distributed irregularly. They do not follow a regular pattern. They could for example be distributed randomly or pseudo-randomly. This may have the effect of better distributing of k-space data irregularly and improving the quality of for example a compressed sensing image reconstruction.

In another embodiment the at least a portion of the k-space lines that are distributed between the discreet sampling planes are distributed in a regular fashion in a linear direction along a Cartesian sampling direction axis. For example, a particular sampling pattern can be used to distribute how the lines of k-space data are offset from the discreet sampling planes.

In another embodiment the at least a portion of the k-space lines that are distributed between the discreet sampling planes can be distributed irregularly or regularly in a linear direction along the Cartesian sampling direction axis. In this embodiment a portion of the k-space lines which are offset from the sampling planes may be distributed in a linear fashion along or offset linearly from the Cartesian sampling direction axis. However, a portion of the k-space lines may be distributed irregularly. For example, near the origin of the Cartesian sampling direction axis it may be beneficial e to have the k-space fully sampled. Within a central region the lines of k-space data could be distributed regularly within this central region. As one is outside of the central region the lines of k-space data could be offset from the discreet sampling planes using a random or pseudo-random offset. This again may have the benefit of improving the quality of the reconstructed magnetic resonance image.

In another embodiment there is a maximum distance between sample points of the three-dimensional stack-of-stars sampling pattern. This would hold not only for lines of the k-space data but also sampling points between various lines. Setting a maximum distance would ensure that there is a certain minimum sampling of the k-space.

In another embodiment there is a minimum distance between the sample points of the three-dimensional stack-of-stars sampling pattern. In this example sample points are prevented from being too close to each other. This may be beneficial because it may force a more uniform or distributed sampling of k-space. This again may be particularly beneficial with undersampled data.

In another embodiment, the maximum distance between sample points is location and/or angle dependent in k-space and the minimum distance between sample points is location and/or angle dependent in k-space. The at least one three-dimensional magnetic resonance image can correspond to a rectangular field of view, wherein maximum distance between sample points and the minimum distance between sample points defines the rectangular field of view.

Before the acquisition of the k-space data, and operator of the magnetic resonance imaging system will typically define a field of view to image, and this is essentially the volume in space that is to be imaged. In magnetic resonance imaging, the locations sampled in k-space determine the field of view. When performing Cartesian k-space sampling it is straight forward to define the sample locations to obtain a rectangular field of view. In radial sampling the radial angles are defined to obtain a rectangular field of view as described in Larson et. al., "Anisotropic Field-of-Views in Radial Imaging," IEEE TRANSACTIONS ON MEDICAL IMAGING, VOL. 27, NO. 1, JANUARY 2008 47-57 or Wu et. al., "Anisotropic Field-of-View support for Golden Angle Radial Imaging." Magn. Reson. Med. 2016 July; 76(1): 229-236. doi:10.1002/mrm.25898.

In another embodiment, the minimum and maximum distance between k-space sample points is scaled according to a specified or predetermined rectangular field of view.

In another embodiment, execution of the machine executable instructions causes the computational system to receive a selection of a rectangular field of view. Execution of the machine executable instructions further causes the computational system to calculate the minimum and maximum distance between k-space sampling locations in the lines of k-space data for a volume representing the rectangular field of view. Execution of the machine executable instructions further causes the computational system to modify the stack-of-stars sampling patter so that it fits the maximum distance between sample points and the minimum distance between sample points in k-space. Parts of the k-space lines in the Cartesian direction can be equidistantly spaced. These can be measured within one shot where a pre-pulse like a fat suppression pulse is preceded. In subsequent shots an irregularly shifted shot can be sampled. Pre-pulses can be also shared over several irregular shifted shots. In addition, radial k-space lines can be shifted regularly or irregularly in the Cartesian direction and correcting for the applied phase shift during reconstruction.

In another embodiment, the location of k-space samples on the lines of k-space data is determined using A Poisson disk algorithm to provide for a (pure) irregular sampling density In another embodiment the three-dimensional stack-of-stars sampling pattern has a sample point density that decreases as the distance from the origin of the Cartesian sampling direction axis increases. In other words, the sampling of low k-space data near the k-space center in the Cartesian sampling direction is higher. This may be particularly beneficial because the higher spatial k-space information can be under sampled without too much loss of image content. This principle is generally applied in the compressibility of images as typically applied in compressed sensing. Ensuring that a central region of the k-space data is better sampled may provide for a higher quality image when it is reconstructed. The sampling density decay can be adjusted to strong, intermediate or low decays that may depend on the expected image content. In case of angiography where the image content is determined by a high contrast of vessels and low contrast of background a strong sampling density decay may be used leading to high acceleration factors, for softer contrasts and intermediate decay may be appropriate.

In another embodiment the sample points of individual lines of at least a portion of the lines of k-space data are distributed irregularly and/or regularly in a length direction following each of the individual lines. In this embodiment there are three cases, there is one where the k-space data on a particular line is distributed irregularly, or it is distributed regularly, and where it is a combination of the two. Having the k-space data distributed irregularly essentially helps to ensure that any artifacts due to undersampling will closer resemble a noise distribution.

It may in some instances be beneficial to for example sample a portion of the k-space data using complete sampling and then undersampling in another region. For example, the central region of the k-space data could be sampled using a regular pattern and then outside of the central region the sampling then becomes irregular. In the other option, a regular pattern is used in each case. This regular sampling may for example be combined with other types of sampling, for example the distribution of k-space lines in a linear direction along the Cartesian sampling direction axis. In one example, the sampling within the discrete sampling planes may be regular and then lines of k-space which are offset from the discreet sampling planes may be irregular. This may also lead to a sampling pattern which better enables the reconstruction of the at least one magnetic resonance image.

In another embodiment at least a portion of the k-space data is arranged according to a sheared lattice in k-space. The sample points may for example be positioned such that a portion of them is on the discreet sampling planes and some of the k-space sampling points are off or between the discreet sampling planes. In some examples the entire k-space sampling pattern follows a sheared structure for the k-space sampling points or in some examples.

The medical system further comprises a magnetic resonance imaging system. The memory further contains pulse sequence commands which are configured to control the magnetic resonance imaging system to acquire the k-space data using the three-dimensional stack-of-stars sampling pattern. Execution of the machine-executable instructions further causes the computational system to acquire the k-space data by controlling the magnetic resonance imaging system with the pulse sequence commands.

It should be noted that the computational system may represent different types of systems in different examples. For example, in conjunction with the previous embodiment, the computational system could be incorporated into a control system for the magnetic resonance imaging system. The reconstruction could for example be performed there. In another example, the computational system may represent one or more computational or computer systems. For example, the control of a magnetic resonance imaging system and the reconstruction of the magnetic resonance image may be divided. The k-space data could be acquired by the magnetic resonance imaging system and then the k-space data could be sent for example to a server in a radiology department or even to a cloud-based reconstruction system. For example, in this case, the data could be acquired using the magnetic resonance imaging system, the k-space data is then sent to the remote or cloud-based system to reconstruct the magnetic resonance image and this system then further sends it to the workstation or the computing system of the radiologist who then examines the image.

Before the acquisition of the k-space data, and operator of the magnetic resonance imaging system will typically define a field of view to image, and this is essentially the volume in space that is to be imaged. In magnetic resonance imaging, the locations sampled in k-space determine the field of view. When performing Cartesian k-space sampling it is straight forward to define the sample locations to obtain a rectangular field of view. In radial sampling it is defined by the radial angles and rectangular field of view scale factor as described in Wu et. al., "Anisotropic Field-of-View support for Golden Angle Radial Imaging," Magn Reson Med. 2016 July; 76(1): 229-236. doi:10.1002/mrm.25898 or the first paragraph of section V of Larson et. al., "Anisotropic Field-of-Views in Radial Imaging," IEEE TRANSACTIONS ON MEDICAL IMAGING, VOL. 27. NO. 1, JANUARY 2008 47-57.

In another embodiment, execution of the machine executable instructions causes the computational system to receive a selection of a rectangular field of view. Execution of the machine executable instructions further causes the computational system to calculate the minimum and maximum distance between k-space sampling locations in the lines of k-space data for a volume representing the rectangular field of view. Execution of the machine executable instructions further causes the computational system to modify the stack-of-stars sampling patter so that it fits the maximum distance between sample points and the minimum distance between sample points in k-space. In another embodiment the decay of the k-space sampling density is adjusted with respect to kz. Strong, intermediate or weak sampling density decays can be used. In another embodiment the medical system comprises a user interface with an acquisition acceleration control. This for example could be a control on a graphical user interface. It may for example have a slider knob or place where an acceleration factor can be entered or chosen. The acquisition acceleration control is configured to provide a chosen acceleration factor. The acceleration factor is often also referred to as the reduction factor or r is defined as a ratio of the amount of k-space data required to be fully sampled to the amount which is actually collected or sampled. For example, if only half of the k-space data is sampled which is necessary to be fully sampled then the acceleration factor would be 2.

Execution of the machine-executable instructions further causes the computational system to receive the chosen acceleration factor from the acquisition acceleration control. Execution of the machine-executable instructions further causes the computational system to calculate a sample point distribution from the three-dimensional stack-of-stars sampling pattern so that a current acceleration factor of the three-dimensional stack-of-stars sampling pattern matches the chosen acceleration factor before acquiring the k-space data. In other words, after receiving the chosen acceleration factor the pulse sequence commands can be modified so that fewer k-space samples are acquired. This enables the operator to have a tradeoff between acquisition time and quality of the reconstructed image.

The sample points can be removed from the three-dimensional stack-of-stars sampling pattern using different techniques. They could for example be removed randomly or pseudo-randomly. In other cases, the sampling points which are removed first may be pre-programmed or contained in a list. In other examples the particular chosen acceleration factor may be programmed by distributing evenly over the $k_z$ and $k_{angle}$ direction taking the rectangular FOV scale factor and strong, intermediate and low signal density decays into account. There are different ways of implementing this and achieving the removal of the sample points from the three-dimensional stack-of-stars sampling pattern.

In another embodiment the three-dimensional stack-of-stars sampling pattern is arranged such that during acquisition of the k-space data adjacent lines of k-space data are rotated using the golden angle rotation scheme or a pseudo-golden angle rotation scheme. The use of a golden angle rotation scheme is useful in several situations. Often times it is useful in reducing an alias pattern within a reconstructed image and also during motion the use of the golden angle rotation scheme is useful when binning or sorting or soft gating of the magnetic resonance imaging k-space data is performed. The golden angle is approximately 111.25°. In schemes where there is a rotation in the sampling pattern the golden angle is sometimes used. The pseudo-golden angle rotation scheme again uses the golden angle but adjusted slightly to fit on an equidistant radial grid. In addition to golden angles also tiny golden angles as described in [Magn Reson Med. 2016 June; 75(6): 2372-8. Golden ratio sparse MRI using tiny golden angles, Wundrak et. al] can be used for e. g. balanced sequences to avoid large k-space jumps.

In another embodiment the k-space data is a four-dimensional dataset. That is to say it is three-dimensional but is also time resolved. The execution of the machine-executable instructions further causes the computational system to assemble the k-space data into time resolved k-space data on a different grid. The term 'time resolved k-space data' refers hereinto as k-space data which has been binned or sorted according to either a particular time interval or a movement phase of the subject. For example, the unit of time could be measured in terms of the subject's dynamic phase after contrast administration, the subject's heart phase and/or respiratory phase. The assembly of the k-space data can be achieved in different ways. As was mentioned lines of k-space can be binned (sorted discreetly) or soft gating can be used also. In soft gating k-space data is weighted according to how much it contributes to a particular time or movement phase by well it matches the particular time interval or the phase of the subject's motion.

The assembly of the k-space data onto a different grid may refers to a re-sampling operation. For example, the k-space data has been acquired at different rotational positions and also different locations along the Cartesian sampling direction. The k-space data for a particular time interval may then be re-sampled and this may aid in the reconstruction. Execution of the machine-executable instructions further causes the computational system to reconstruct a four-dimensional image sequence from the time resolved k-space data. As was mentioned before, this may be a four-dimensional image which shows an evolution through time or the time may be measured in terms of the movement phase of the subject. For example, the four-dimensional image sequence could be a dynamic phase image, a cardiac cine image which is compensated for both cardiac and respiratory phase.

In another embodiment, the k-space data is combined using a k-space weighting reconstruction algorithm or using a certainty map reconstruction. One example of this would be that, the k-space data is combined using a K-space Weighted Image Contrast (KWIC) weighting reconstruction. The KWIC reconstruction is also known as the k-space weighted image contrast reconstruction. In this particular embodiment the radial central region of k-space is highly oversampled. During the acquisition of the k-space data the ions of k-space data may be acquired in groups or passes which make a collection of k-space data from the different dynamic, respiratory and cardiac phases. The k-space may be weighted during reconstruction with the goal to provide an optimal image contrast for the requested temporal phase. This can be achieved by providing weights or certainty maps to the compressed sensing and AI algorithm. This embodiment has the benefit of providing a high-quality image with sufficient SNR and resolution eliminating streaking artifacts in the resulting magnetic resonance image.

In another embodiment the time resolved k-space data is motion resolved k-space data and is assembled using self-navigation or subject motion sensor data. For example, the oversampled radial k-space data could be used for self-navigation taking coil element information into account. In other examples there may for example be an ECG or breathing sensor (e. g. camera) on the subject to record subject motion data. This may be used for either binning or soft gating the data. The k-space data is further assembled into in the motion resolved k-space data using binning or soft gating. The computational system may be configured or programmed to assemble the time resolved k-space data using self-navigation or a subject motion sensor data. The computational system may be further configured such that execution of the machine-executable instructions cause the k-space data to be assembled into the motion resolved k-space data using the binning or soft gating.

In another embodiment the k-space data is undersampled. This embodiment may for example be beneficial because having lines of k-space data sampled that are offset from the discreet sampling planes may provide for a better reconstruction of the undersampled image.

In another embodiment the at least one three-dimensional magnetic resonance image is reconstructed using a compressed sensing reconstruction algorithm.

In another embodiment the at least one three-dimensional magnetic resonance image is reconstructed using a neural network reconstruction algorithm. This embodiment could take different forms. There for example could be a neural network that has been trained to reconstruct the image completely from the undersampled k-space data. However, often times the neural network reconstruction algorithm is a compressed sensing reconstruction algorithm that integrates a neural network into the compressed sensing algorithm.

Within the compressed sensing algorithm, the image is reconstructed from the current k-space data and then a denoising filter is applied and this is then used in a daily consistency step and iteratively the quality of the image is improved. The neural network can be used for any of these various steps of the compressed sensing algorithm. Using the neural network as the denoising filter is often times very effective in improving the quality of the compressed sensing algorithm. For example, the denoising filter can be trained for particular views or types of images. In this case the denoising filter is not just a straight noise filter but is also able to incorporate essentially prior knowledge about the type of magnetic resonance imaging scan that is performed. Prior knowledge on the temporal and motion information in terms of k-space weights/certainty maps could be provided to the compressed sensing algorithm and/or neural network. This would be trained by using the fully sampled images or fully sampled k-space datasets (maybe KWIC filtered) which are used to produce images and by taking a portion of this fully sampled k-space data simulated undersampled data can be made. This undersampled simulated k-space data can then be used in the compressed sensing algorithm and the resulting images can be input into the neural network. This can then be compared to an image constructed from the fully sampled set of data.

In another aspect the invention provides for a computer program that comprises machine-executable instructions for execution by a computational system controlling the medical system. Execution of the machine-executable instructions causes the computational system to receive k-space data. The k-space data comprises lines of k-space data sampled according to a three-dimensional stack-of-stars sampling pattern. The three-dimensional stack-of-stars comprises discreet sampling planes distributed periodically along a Cartesian sampling direction axis. The lines of k-space data pass through the Cartesian sampling direction axis and also perpendicular to the Cartesian sampling direction axis. At least a portion of the lines of k-space data are divided between the discreet sampling planes. Execution of the machine-executable instructions further causes the computational system to reconstruct at least one three-dimensional magnetic resonance image from the k-space data.

In another aspect the invention provides for a method of medical imaging. The method comprises receiving k-space data. The k-space data comprises lines of k-space data sampled according to a three-dimensional stack-of-stars sampling pattern. The three-dimensional stack-of-stars comprises discreet sampling planes distributed periodically along a Cartesian sampling direction axis. The lines of k-space data pass through the Cartesian sampling direction axis. The lines of k-space data are also perpendicular to the Cartesian sampling direction axis. At least a portion of the lines of k-space data are distributed between the discreet sampling planes. The method further comprises reconstructing at least one three-dimensional magnetic resonance image from the k-space data.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit." "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor or computational system of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the computational system of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the computational system. Examples of optical disks include Compact Disks (CD) and Digital Versatile Disks (DVD), for example CD-ROM. CD-RW, CD-R, DVD-ROM, DVD-RW, or DVD-R disks. The term computer readable-storage medium also refers to various types of recording media capable of being accessed by the computer device via a network or communication link. For example, data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a computational system. 'Computer storage' or 'storage' is a further example of a computer-readable storage medium. Computer storage is any non-volatile computer-readable storage medium. In some embodiments, computer storage may also be computer memory or vice versa.

A 'computational system' as used herein encompasses an electronic component which is able to execute a program or machine executable instruction or computer executable code. References to the computational system comprising the example of "a computational system" should be interpreted as possibly containing more than one computational system or processing core. The computational system may for instance be a multi-core processor. A computational system may also refer to a collection of computational systems within a single computer system or distributed amongst multiple computer systems. The term computational system should also be interpreted to possibly refer to a collection or network of computing devices each comprising a processor or computational systems. The machine executable code or instructions may be executed by multiple computational systems or processors that may be within the same computing device or which may even be distributed across multiple computing devices such as the multiple computing cores of a graphical processing unit (GPU).

Machine executable instructions or computer executable code may comprise instructions or a program which causes a processor or other computational system to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances, the computer executable code may be in the form of a high-level language or in a pre-compiled form and be used in conjunction with an interpreter which generates the machine executable instructions on the fly. In other instances, the machine executable instructions or computer executable code may be in the form of programming for programmable logic gate arrays.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further understood that, when not mutually exclusive, combinations of blocks in different flowcharts, illustrations, and/or block diagrams may be combined. These computer program instructions may be provided to a computational system of a general purpose computer, special purpose computer, or other programmable data processing apparatus to produce a machine, such that the instructions, which execute via the computational system of the computer or other programmable data processing apparatus, create means for implementing the functions/acts specified in the flowchart and/or block diagram block or blocks.

These machine executable instructions or computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The machine executable instructions or computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer to indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the computational system of a computer system to interact with and/or control an external computing device and/or apparatus. A hardware interface may allow a computational system to send control signals or instructions to an external computing device and/or apparatus. A hardware interface may also enable a computational system to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF). Light-emitting diode (LED) displays, Electroluminescent display (ELD), Plasma display panels (PDP), Liquid crystal display (LCD). Organic light-emitting diode displays (OLED), a projector, and Head-mounted display.

K-space data is defined herein as being the recorded measurements of radio frequency signals emitted by atomic spins using the antenna of a Magnetic resonance apparatus during a magnetic resonance imaging scan. Magnetic resonance data is an example of tomographic medical image data.

A Magnetic Resonance Imaging (MRI) image or MR image is defined herein as being the reconstructed two- or three-dimensional visualization of anatomic data contained within the magnetic resonance imaging data. This visualization can be performed using a computer.

BRIEF DESCRIPTION OF THE DRAWINGS

In the following preferred embodiments of the invention will be described, by way of example only, and with reference to the drawings in which.

DESCRIPTION OF EMBODIMENTS

Like numbered elements in these figures are either equivalent elements or perform the same function. Elements which have been discussed previously will not necessarily be discussed in later figures if the function is equivalent.

Figure 1:
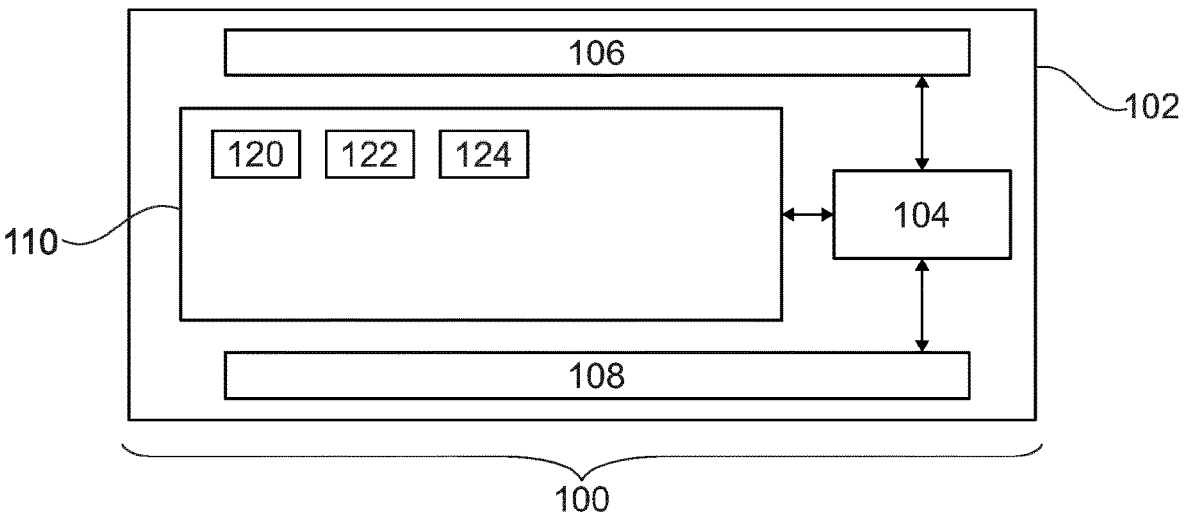
FIG. 1 illustrates an example of a medical system.

FIG. 1 illustrates an example of a medical system 100. In this example the medical system 100 is shown to comprise a computer 102. The computer 102 may represent one or more computer systems that are distributed at one or more locations. The computer 102 is shown as comprising a computational system 104. The computational system 104 is also intended to represent one or more computational systems that may be located in one or more machines. The computational system 104 is shown as being in communication with an optional hardware interface 106 and an optional user interface 108. The hardware interface 106 may for example be the computational system 104 to communicate with other components of the medical system 100 if they are present. The user interface 108 may enable an operator to control the operation and function and interact with the medical system 100.

The computational system 104 is further shown as being in communication with a memory 110. The memory 110 is intended to represent different types of memory that may be accessible to the computational system 104.

The memory 110 is shown as containing machine-executable instructions 120. The machine-executable instructions 120 enable the computational system 104 to perform various data tasks such as numerical calculations and image processing. In the case that the medical system 100 comprises further components the machine-executable instructions 120 may also be configured to allow the computational system 104 to control these additional components. For example, if the medical system 100 were to comprise a magnetic resonance imaging system the machine-executable instructions 120 would enable the computational system 104 to control the magnetic resonance imaging system.

The memory 110 is further shown as containing k-space data 122. The k-space data comprises lines of k-space data sampled according to a three-dimensional stack-of-stars sampling pattern. The three-dimensional stack-of-stars comprises discreet sampling planes distributed periodically along a Cartesian sampling direction axis. The lines of k-space data pass through the Cartesian sampling direction axis. The lines of k-space data are perpendicular to the Cartesian sampling direction axis. At least a portion of the lines of k-space data are distributed between the discreet sampling planes. The memory 110 is further shown as containing a three-dimensional magnetic resonance image 124 that has been reconstructed from the k-space data 122. The machine-executable instructions 120 may be configured to perform the reconstruction of the three-dimensional magnetic resonance image 124 from the k-space data 122.

Figure 2:
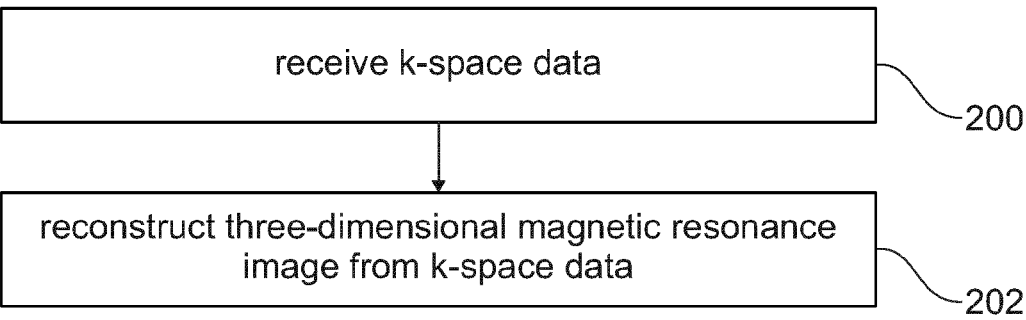
FIG. 2 shows a flow chart which illustrates a method of using the medical system of FIG. 1.

FIG. 2 shows a flowchart which illustrates a method of operating the medical system 100 of FIG. 1. First in step 200 the k-space data 122 is received. Then in step 202 the three-dimensional magnetic resonance image 124 is reconstructed form the k-space data 122.

Figure 3:
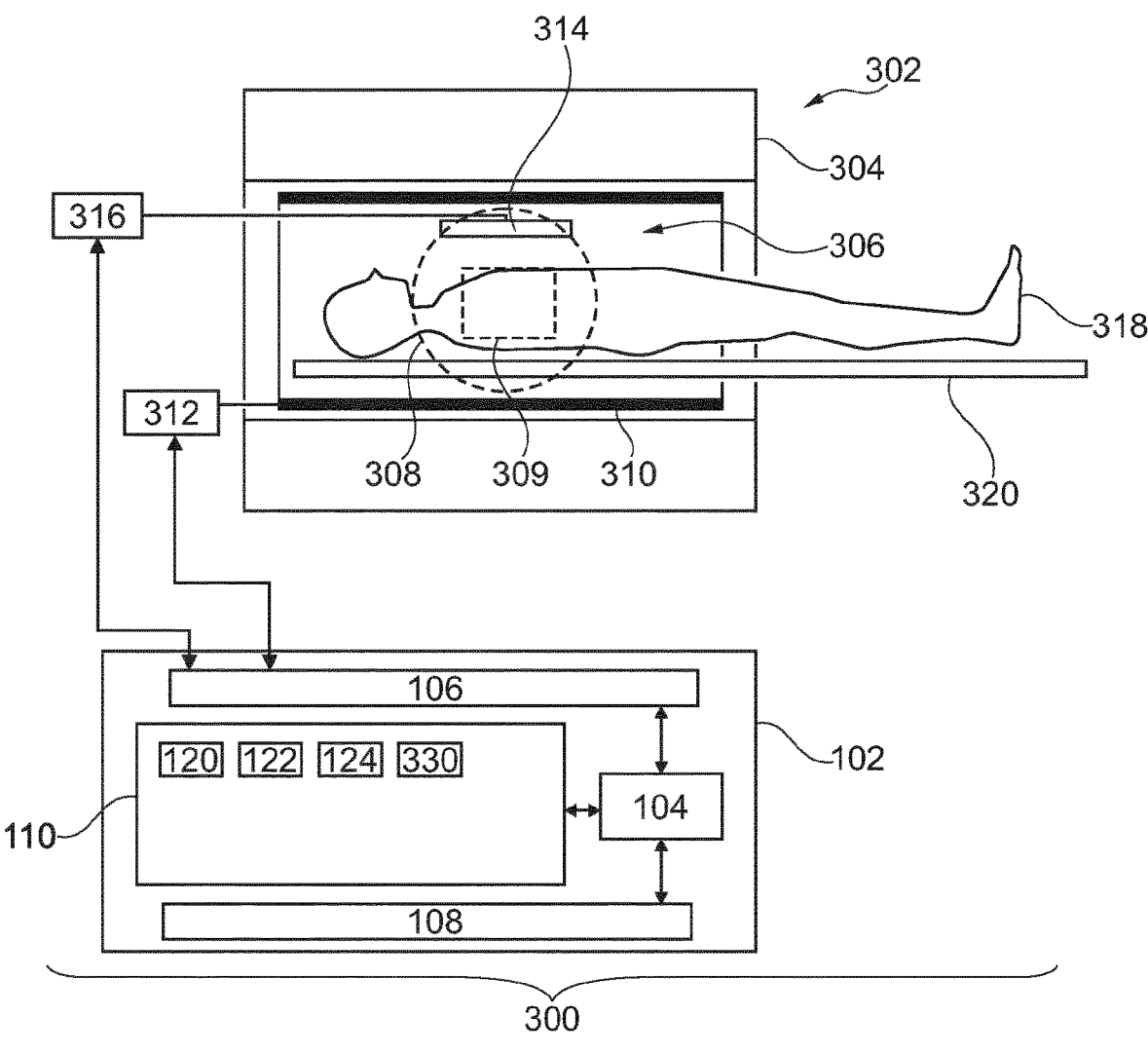
FIG. 3 illustrates an example of a medical system.

FIG. 3 illustrates a further example of a medical system 300. The medical system 300 illustrated in FIG. 3 is similar to the medical system 100 of FIG. 1 except that it additionally comprises a magnetic resonance imaging system 302 that is controlled by the computational system 104.

The magnetic resonance imaging system 302 comprises a magnet 304. The magnet 304 is a superconducting cylindrical type magnet with a bore 306 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils.

Within the bore 306 of the cylindrical magnet 304 there is an imaging zone 308 where the magnetic field is strong and uniform enough to perform magnetic resonance imaging. A field of view 309 is shown within the imaging zone 308. The magnetic resonance data that is acquired typically acquired for the field of view 309. A subject 318 is shown as being supported by a subject support 320 such that at least a portion of the subject 318 is within the imaging zone 308 and the field of view 309.

Within the bore 306 of the magnet there is also a set of magnetic field gradient coils 310 which is used for acquisition of preliminary magnetic resonance data to spatially encode magnetic spins within the imaging zone 308 of the magnet 304. The magnetic field gradient coils 310 connected to a magnetic field gradient coil power supply 312. The magnetic field gradient coils 310 are intended to be representative. Typically magnetic field gradient coils 310 contain three separate sets of coils for spatially encoding in three orthogonal spatial directions. A magnetic field gradient power supply supplies current to the magnetic field gradient coils. The current supplied to the magnetic field gradient coils 310 is controlled as a function of time and may be ramped or pulsed.

Adjacent to the imaging zone 308 is a radio-frequency coil 314 for manipulating the orientations of magnetic spins within the imaging zone 308 and for receiving radio transmissions from spins also within the imaging zone 308. The radio frequency antenna may contain multiple coil elements. The radio frequency antenna may also be referred to as a channel or antenna. The radio-frequency coil 314 is connected to a radio frequency transceiver 316. The radio-frequency coil 314 and radio frequency transceiver 316 may be replaced by separate transmit and receive coils and a separate transmitter and receiver. It is understood that the radio-frequency coil 314 and the radio frequency transceiver 316 are representative. The radio-frequency coil 314 is intended to also represent a dedicated transmit antenna and a dedicated receive antenna. Likewise the transceiver 316 may also represent a separate transmitter and receivers. The radio-frequency coil 314 may also have multiple receive/transmit elements and the radio frequency transceiver 316 may have multiple receive/transmit channels.

The transceiver 316 and the gradient controller 312 are shown as being connected to the hardware interface 106 of the computer system 102.

The memory 110 is shown as containing pulse sequence commands 330. The pulse sequence commands are commands or data which can be converted into commands which can be used to control the magnetic resonance imaging system 302 to acquire k-space data 332. The pulse sequence commands 330 are configured to acquire the k-space data 122 such that lines of k-space data are acquired according to a three-dimensional stack-of-stars sampling pattern. The sampling pattern has discreet sampling planes that are distributed periodically along a Cartesian sampling direction axis. The lines of k-space data pass through the Cartesian sampling direction axis and are perpendicular to this axis. At least a portion of the lines of k-space data are distributed between the discreet sampling planes.

Figure 4:
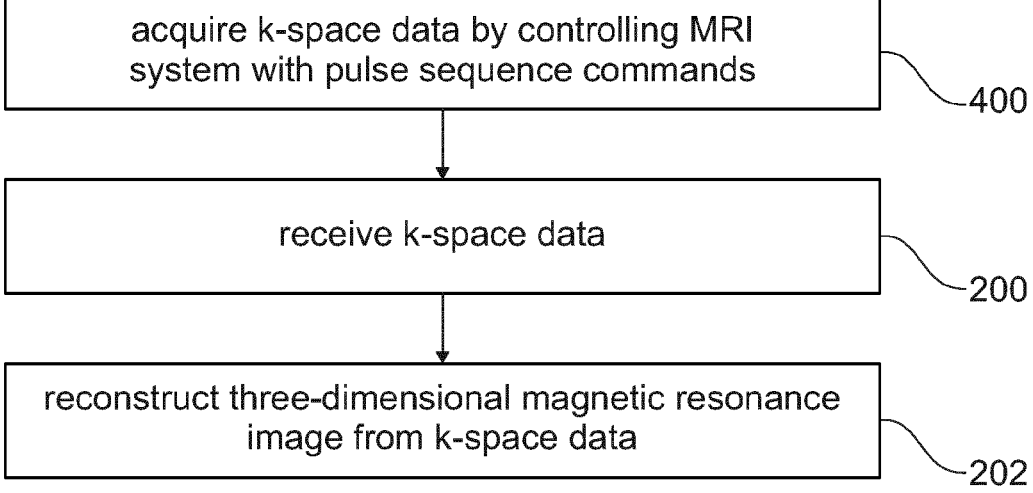
FIG. 4 shows a flow chart which illustrates a method of using the medical system of FIG. 3.

FIG. 4 shows a flowchart illustrating a method of operating the medical system 300 of FIG. 3. First, in step 400, the computational system 104 uses the pulse sequence commands 330 to control the magnetic resonance imaging system 302 to acquire the k-space data 122. Next, the method proceeds to steps 200 and 202 as is illustrated in FIG. 2.

Figure 5:
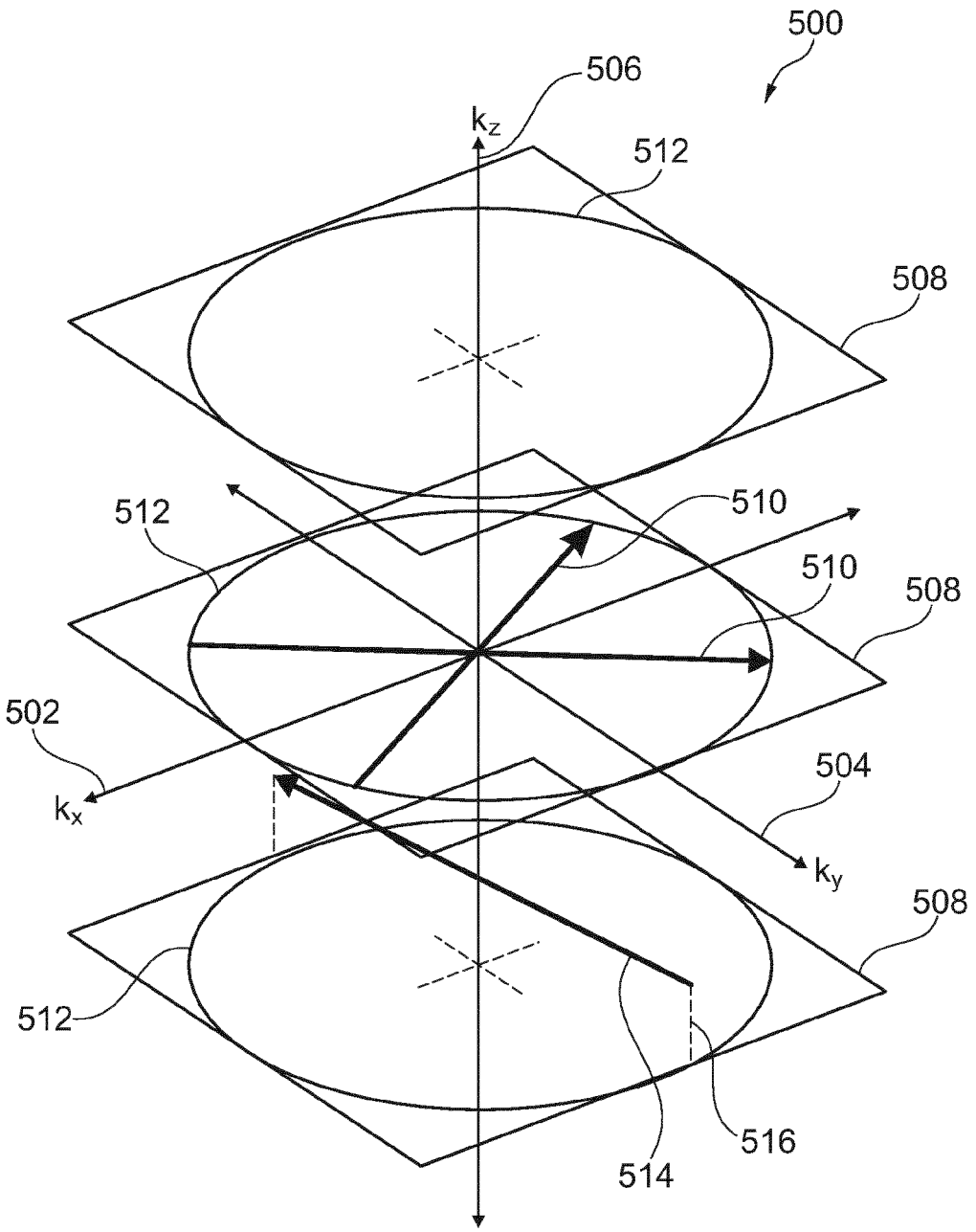
FIG. 5 illustrates a coordinate system.

FIG. 5 shows an illustration of a stack-of-stars sampling patter in k-space 500. The $k_y$ axis 502, the $k_y$ axis 504, and the $k_z$ axis 506 are visible. In this example the $k_z$ axis 506 is considered to be the Cartesian sampling direction axis 506. In this particular example there are three discreet sampling planes 508 that are visible. Normally, in a stack-of-stars sampling pattern the lines of k-space are restricted to the planes 508. In one of the planes 508 are shown two in-plane sampling lines of k-space 510 that are shown as rotating about the Cartesian sampling direction axis 506. The circles 512 indicate rotation about the axis 506. In the present example at least a portion of the lines of k-space data are distributed between the discreet sampling planes 508. In FIG. 5 one of these lines of k-space data 514 is shown. The out-of-plane sampling line of k-space data 514 is offset 516 from the plane 508 along the axis 506.

Figure 6:
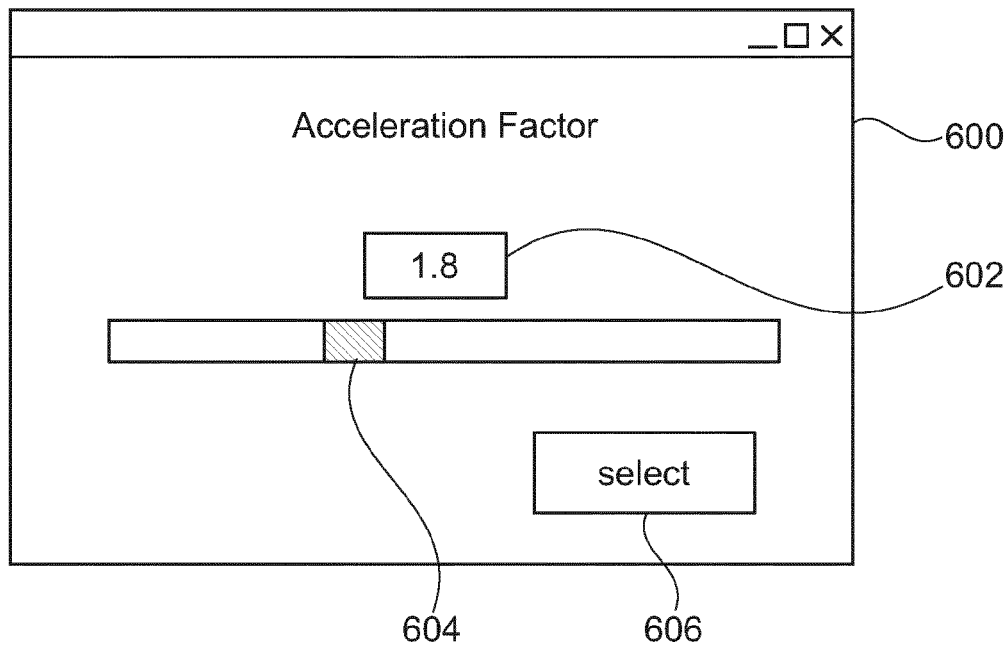
FIG. 6 illustrates an example of an acquisition acceleration control.

FIG. 6 illustrates an example of an acquisition acceleration control 600. This could for example be implemented as a graphical user interface for a user interface. The acquisition acceleration control 600 is displayed as a window 600. The window 600 has a displayed and/or editable acceleration factor 602. To modify the acceleration factor there is also a slider control 604. Other controls such as buttons, dials or other graphical user interface controls could also be used. Once the correct acceleration factor is selected there is a button 606 to accept or select the displayed acceleration factor 602. After button 606 is pressed then the system illustrated in FIG. 3 may go and edit the pulse sequence commands 330 so that the acquired k-space data has the acceleration factor matching the value of 602. One straightforward way of doing this could be to calculate a sampling pattern for the k-space data taking the specified (Rectangular) FOV and sampling density function into account and then evenly distribute samples in both the $k_z$ and $k_{angle}$ direction (as specified by the input criteria) so that it has the proper acceleration factor. For the even distribution the distance to neighboring profiles could be taken into account shifting radial k-space lines to intermediate $k_z$ planes. Shifting k-space lines on an irregular grid using dithering further distributes k-space sampling with an improved noise characteristic. Coil sensitivity profiles further could be taken into account to optimize the distribution of samples in $k_z$ and $k_{angle}$ direction.

4D radial stack of stars offers several promising advantages for clinical scanning like significantly higher robustness to motion and benign aliasing artifacts. Despite the benefits, current technology still does not provide the temporal and spatial fidelity required for T1 contrast enhanced free breathing body imaging, showing in contrast and motion blurring. The invention suggests an irregular 3D and 4D radial sampling scheme optimized for CSENSE and AI.

3D radial stack of stars offers several promising advantages for clinical scanning like significantly higher robustness to motion, no aliasing artifacts and benign under sampling behavior. Despite the benefits, current technology still does not provide the temporal and spatial fidelity required for T1 contrast enhanced free breathing body imaging showing in contrast and motion blurring. Examples may provide for an irregular 3D and 4D radial sampling scheme that could be optimized for CSENSE (compressed sensing reconstruction) and AI (for example a reconstruction that integrates a neural network in its algorithm).

Examples may contain one or more of the following features:

Variable density radial sampling in k-space where the center part of k-space is oversampled The $K_{angle}$-$k_z$ space is irregular, golden angle radial under sampled towards higher k-space Coil sensitivities may be taken into account for an optimized distribution in $k_{angle}$-$k_z$ space that can differ per direction A single acceleration user interface parameter is offered calculating the optimal distribution in $k_{angle}$-$k_z$ space CSENSE or AI may be used for reconstruction a 3D magnetic resonance image For 4D imaging continuous golden angle sampling may be done and view sharing is used to reconstruct subsequent dynamic scans. The center part of k-space is sampled more frequent in Kt space than the peripheral k-space by the use of stronger CSENSE sampling decays Examples may provide for a radial sampling scheme that guarantees high acceleration factors by irregularly under sampling in $k_{angle}$-$k_z$ space as illustrated in FIG. 7 below.

Figure 7:
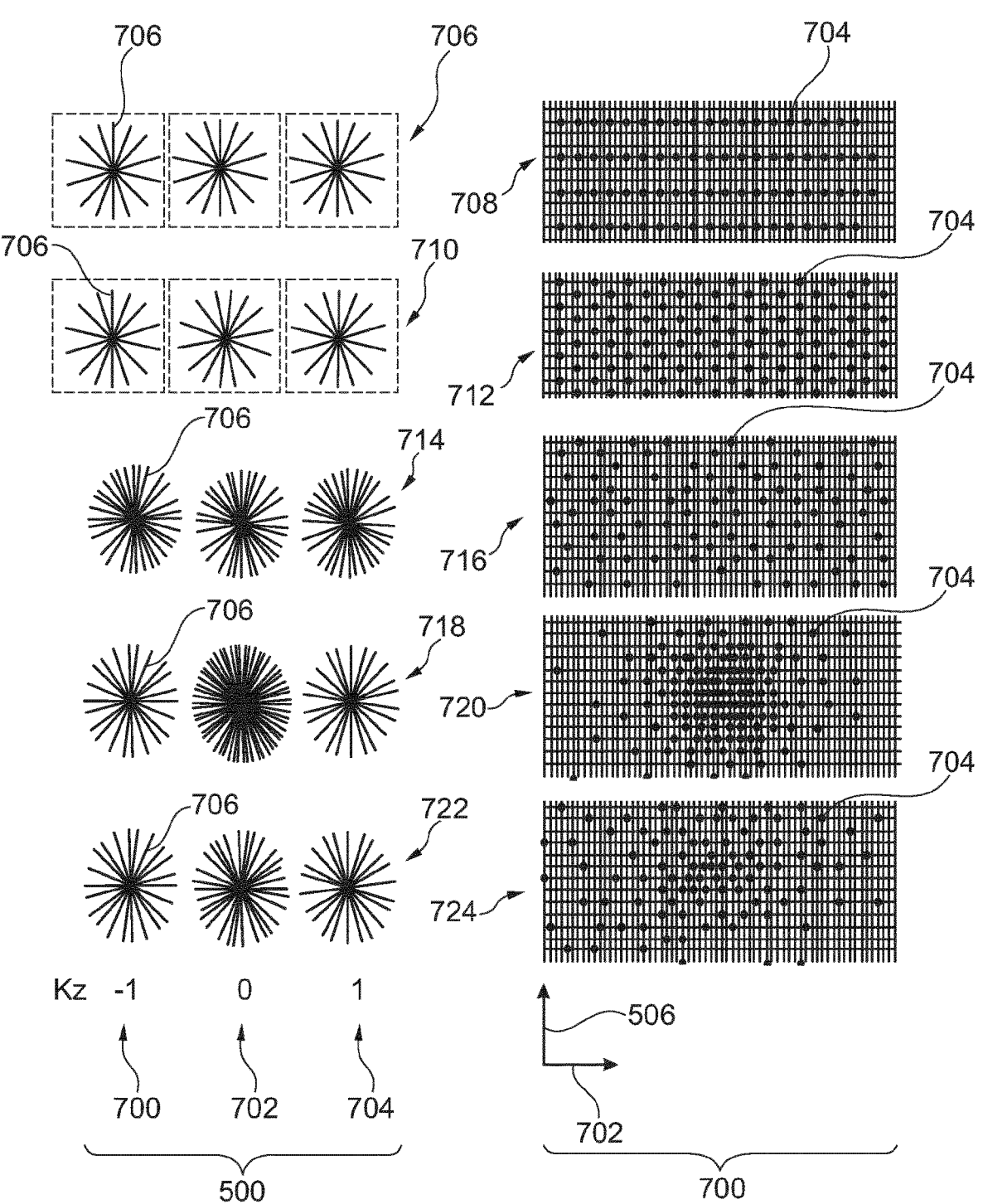
FIG. 7 illustrates an example of a k-space sampling pattern.

FIG. 7 illustrates various types of k-space sampling patterns. In the first column various stack-of-stars sampling patterns 500 are shown. Each stack-of-stars sampling pattern is represented by discrete sampling planes 700, 702, and 704. Within each of the discrete sampling planes 700, 702, and 704, there are sampling lines for k-space 706. Only one sampling line 706 is marked in each example. In these examples, the sampling lines 706 are only drawn as being within the discrete sampling planes 700, 702, and 704. In all of the examples shown in FIG. 7, individual sampling lines 706 may be displaced out of the planes.

Adjacent to each of the stack-of-stars sampling patterns 500 there is a two-dimensional plot which shows the location of sampling points 700 represented as an oversample grid. The vertical axis represents is in the Cartesian sampling direction 506 and the horizontal axis represents the radial angular k-space direction 702

Dots on the grids 704 represent sample points in k-space where the kz space points are shown on the oversample grid. One dot 704 is marked per example.

Stack-of-stars sampling pattern 706 and oversample grid 708 represents a conventional regular 3D radial stack-of-stars sampling pattern.

Stack-of-stars sampling pattern 710 and oversample grid 712 represents an example of a sheared k-space sampling pattern 1002. In this example, every odd radial k-space line is shifted by half a voxel. This simple shift leads to an improved k-space distribution.

Stack-of-stars sampling pattern 714 and oversample grid 716 represents an example of a variable k-space sampling pattern where there is a slow decay (with a weak signal density decay) in the density of the k-space sampling points as one goes further away from the origin.

Stack-of-stars sampling pattern 718 and oversample grid 720 represents a further example of a variable k-space sampling pattern. A parameter sampling density may be used describe a second main characteristic of the sampling pattern. It can be: uniform or variable. It describes how the local average sampling density depends on the (radial) position in k-space. In this case there is a very rapid decay in the density of k-space sample points as one goes further away from the origin. As mentioned above, examples 714 and 716 represent a slow decay.

Stack-of-stars sampling pattern 722 and oversample grid 724 represents an irregular sampling is shown where the Center k-space is over sampled with an increased k-space angular density while the peripheral k-space is under sampled. The samples are irregularly distributed in both Cartesian 506 and Radial direction 702. Neighboring $k_{angle}$ points are golden angle sorted. Note a k-space shutter can be applied for further scan time reduction—not sampling those outer $k_z$ and angular k-space points.

The variable density under sampling guarantees high under sampling of the higher k-space frequencies. Hereby the sampling density depends on the position in kz-space. Central k-space is sampled denser. Towards higher k-space the radial density is reduced.

Figure 8:
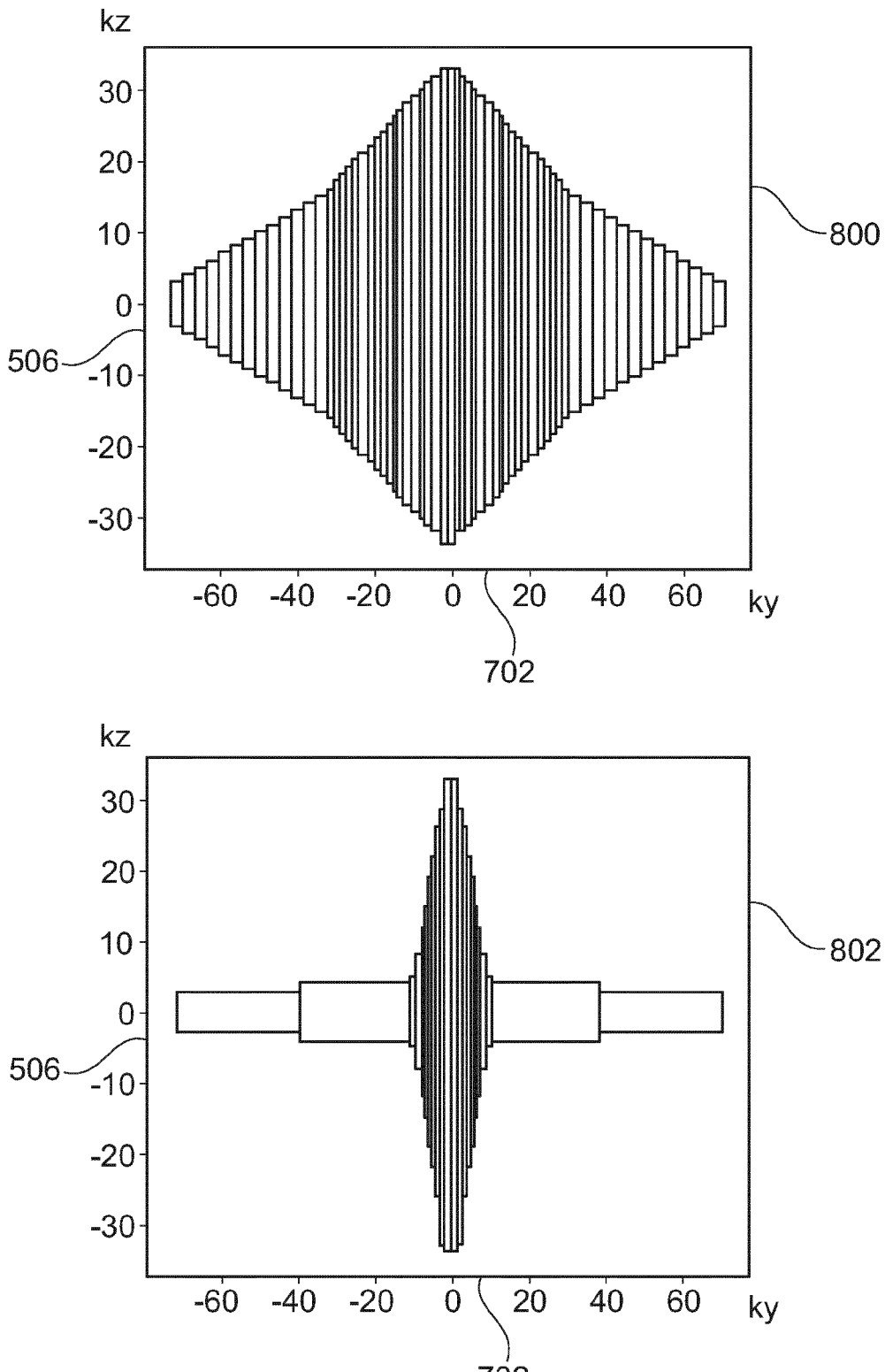
FIG. 8 illustrates several examples of signal density functions.

FIG. 8. illustrates an example of a weak 800 and a strong 802 signal density decay (SDC) function with the 3D CS sampling scheme.

Typically, the cartesian $k_z$ lines are sampled first to avoid motion related k-space discontinuities and is continued by increasing golden angles for optimal distribution. The irregular sampling pattern helps to distribute the radial under sampling artifact offering the possibilities of higher acceleration factors.

A single acceleration factor in the user interface can be used to calculate the optimal acceleration distribution in the Radial and Cartesian direction. Coil sensitivity profiles may be taken into account here. CSENSE or AI is used for reconstruction a 3D magnetic resonance image.

For 4D imaging continuous golden angle sampling is done and view sharing or more advanced k-t techniques or compressed sensing in the temporal direction may be used to reconstruct subsequent dynamic scans. The center part of k-space may be sampled more frequent in $k_t$ space than the peripheral k-space by the use of stronger CSENSE sampling decays (SDC)

A Poisson disk algorithm (randomness, gaps, clustering) "Dithering" can be used for pure irregular sampling density. It may be used to generate an incomplete (subsampled) set of sample points on an underlying Cartesian grid in a k space, within the following constraints:

1. The samples are be randomly distributed
2. The (locally averaged) sampling density must follow some prescribed sampling density function, typically a function of the radial distance from the k-space origin.
3. The samples must not cluster, meaning: the distance between any pair of two samples must not be smaller than some minimum. In case of varying sampling density or variable angular density sampling as used in rectangular FOV sampling, the minimum distance scales with the sampling density.

4. There are not be large gaps, meaning: there are not be any non-sampled grid points that could have been sampled, still satisfying the previous minimum distance requirement.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

REFERENCE SIGNS LIST

100 medical system
102 computer
104 computational system
106 optional hardware interface
108 optional user interface
110 memory
120 machine executable instructions
122 k-space data
124 three-dimensional magnetic resonance image
200 receive k-space data
202 reconstruct at least one three-dimensional magnetic resonance image from the k-space data
300 medical system
302 magnetic resonance imaging system
304 magnet
306 bore of magnet
308 imaging zone
309 field of view
310 magnetic field gradient coils
312 magnetic field gradient coil power supply
314 radio-frequency coil
316 transceiver
318 subject
320 subject support
330 pulse sequence commands
400 acquire the k-space data by controlling the magnetic resonance imaging system with the pulse sequence commands
500 stack-of-stars sampling pattern in k-space
502 $k_x$ axis
504 $k_y$ axis
506 $k_z$ axis (cartesian sampling direction axis)
508 discrete sampling plane
510 in plane sampling line of k-space 512 indicates rotation about cartesian sampling direction axis
514 out of plane sampling line of k-space data
516 linear offset from discrete sampling plane along cartesian sampling direction axis
600 acquisition acceleration control
602 displayed/editable acceleration factor
604 slider control
606 select acceleration factor button
700 oversample grids showing location of sampling points
702 radial angular k-space direction 704
704 sampling location
800 weak SDC function
802 strong SDC function

The invention claimed is:

1. A medical system comprising:

a memory configured to store machine executable instructions;

a computational system, wherein execution of the machine executable instructions causes the computational system to:

receive k-space data, wherein the k-space data comprises lines of k-space data sampled according to a three-dimensional stack of stars sampling pattern, wherein the three-dimensional stack of stars comprises discrete sampling planes distributed periodically at a regular interval displaced along a cartesian sampling direction axis, wherein a portion the lines of k-space data pass through the cartesian sampling direction axis, wherein the portion of the lines of k-space data are perpendicular to the cartesian sampling direction axis, wherein at least another portion of the lines of k-space data are distributed between the discrete sampling planes;

receive a selection of a rectangular field of view;

calculate the minimum and maximum distance between k-space sampling locations in the lines of k-space data for a volume representing the rectangular field of view;

modify the stack of stars sampling pattern so the stack of stars fits the maximum distance between sample points and the minimum distance between sample points in k-space; and reconstruct at least one three-dimensional magnetic resonance image from the k-space data, wherein the at least a portion of the k-space lines distributed between the discrete sampling planes are distributed irregularly in a linear direction aligned with the cartesian sampling direction axis.

2. The medical system of claim 1, wherein a Poisson disk algorithm is used to determine the location of sample points on the lines of k-space data.

3. The medical system of claim 1, wherein the distance between k-space sample points is scaled according to a predetermined rectangular field of view.

4. The medical system of claim 1, wherein the three-dimensional stack of stars sampling pattern has a sample point density that decreases as the distance from the origin of the cartesian sampling direction axis increases.

5. The medical system of claim 1, wherein sample points of individual lines of at least a portion of the lines of k-space data are distributed irregularly and/or regularly in a length direction following each of the individual lines.

6. The medical system of claim 1, wherein at least a portion of the k-space data is arranged according to a sheared lattice in k-space.

7. The medical system of claim 1, wherein the medical system further comprises a magnetic resonance imaging system, wherein the memory further comprises pulse sequence commands configured to control the magnetic resonance imaging system to acquire the k-space data using the three-dimensional stack of stars sampling pattern, wherein execution of the machine executable instructions further causes the computational system to acquire the k-space data by controlling the magnetic resonance imaging system with the pulse sequence commands.

8. The medical system of claim 7, wherein the medical system comprises a user interface with an acquisition acceleration control, wherein the acquisition acceleration control is configured to provide a chosen acceleration factor, wherein execution of the machine executable instructions further causes the computational system to:

receive the chosen acceleration factor from the acquisition acceleration control; and calculate a sample point distributions from the three-dimensional stack of stars sampling pattern so that a current acceleration factor of the three-dimensional stack of stars sampling pattern matches the chosen acceleration factor before acquiring the k-space data.

9. The medical system of claim 1 wherein the three-dimensional stack of stars sampling pattern is arranged such that during an acquisition of the k-space data adjacent lines of k-space data are rotated using a golden angle rotation scheme or a pseudo-golden angle rotation scheme.

10. The medical system of claim 1, wherein the k-space data is a four-dimensional data set, wherein execution of the machine executable instructions further causes the computational system to:

assemble the k-space data into time resolved k-space data on a different grid; and reconstruct a four-dimensional image sequence from the time resolved k-space data.

11. The medical system of claim 10, wherein the k-space data is combined using a k-spaced weighting reconstruction algorithm or using a certainty map.

12. The medical system of claim 1, wherein the k-space data is undersampled, wherein at least one of the following holds:

the at least one three-dimensional magnetic resonance image is reconstructed using a compressed sensing reconstruction algorithm; and the at least one three-dimensional magnetic resonance image is reconstructed using a neural network reconstruction algorithm.

13. The medical system of claim 1, wherein the computational system is further adapted to generate provide the magnetic resonance image on a display.

14. A computer program comprising machine executable instructions stored on a non-transitory computer readable medium for execution by a computational system, wherein execution of the machine executable instructions causes the computational system to:

receive k-space data, wherein the k-space data comprises lines of k-space data sampled according to a three-dimensional stack of stars sampling pattern, wherein the three-dimensional stack of stars comprises discrete sampling planes distributed periodically at a regular interval displaced along a cartesian sampling direction axis, wherein a portion of the lines of k-space data pass through the cartesian sampling direction axis, wherein the portion of the lines of k-space data are perpendicular to the cartesian sampling direction axis, wherein at least another portion of the lines of k-space data are distributed between the discrete sampling planes;

receive a selection of a rectangular field of view;

calculate the minimum and maximum distance between k-space sampling locations in the lines of k-space data for a volume representing the rectangular field of view;

modify the stack of stars sampling pattern so that the stack of stars fits the maximum distance between sample points and the minimum distance between sample points in k-space; and reconstruct at least one three-dimensional magnetic resonance image from the k-space data, wherein the at least a portion of the k-space lines distributed between the discrete sampling planes are distributed irregularly in a linear direction aligned with the cartesian sampling direction axis.

15. The computer program of claim 14, wherein the computational system is further adapted to provide the magnetic resonance image on a display.

16. A method of medical imaging, wherein the method comprises:

receiving k-space data, wherein the k-space data comprises lines of k-space data sampled according to a three-dimensional stack of stars sampling pattern, wherein the three-dimensional stack of stars comprises discrete sampling planes distributed periodically at a regular interval displaced along a cartesian sampling direction axis, wherein a portion of the lines of k-space data pass through the cartesian sampling direction axis, wherein the portion of the lines of k-space data are perpendicular to the cartesian sampling direction axis, wherein at least a portion of the lines of k-space data are distributed between the discrete sampling planes;

receiving a selection of a rectangular field of view;

calculating the minimum and maximum distance between k-space sampling locations in the lines of k-space data for a volume representing the rectangular field of view;

modifying the stack of stars sampling pattern so that it fits the maximum distance between sample points and the minimum distance between sample points in k-space; and reconstructing at least one three-dimensional magnetic resonance image from the k-space data, wherein the at least a portion of the k-space lines distributed between the discrete sampling planes are distributed irregularly in a linear direction aligned with the cartesian sampling direction axis.

17. The computer program of claim 14, wherein the distance between k-space sample points is scaled according to a predetermined rectangular field of view.

18. The computer program of claim 14, wherein the three-dimensional stack of stars sampling pattern has a sample point density that decreases as the distance from the origin of the cartesian sampling direction axis increases.

19. The computer of claim 14, wherein sample points of individual lines of at least a portion of the lines of k-space data are distributed irregularly and/or regularly in a length direction following each of the individual lines.

20. The method of claim 16, wherein the method further comprises providing the magnetic resonance image on a display.

* * * * *